AMPLITUDE STABILIZED VARIABLE FREQUENCY OSCILLATOR
Filed March 13, 1961
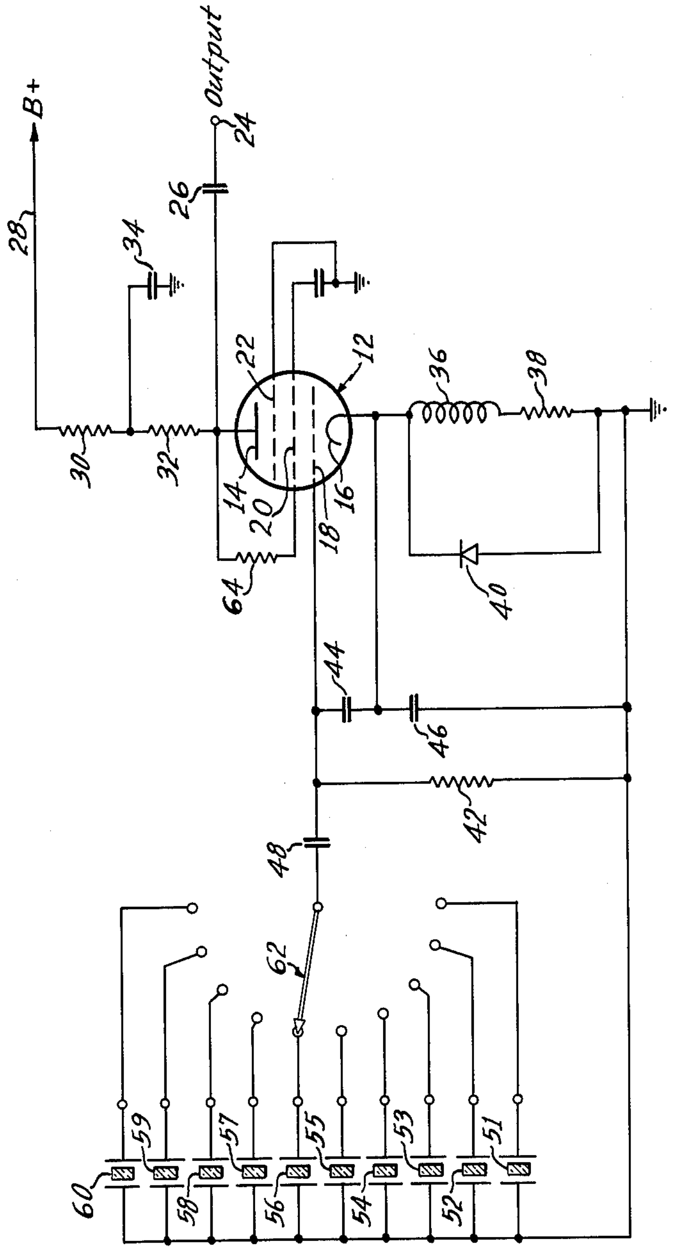
INVENTOR.
JACK BRIAN
BY Alan C. Rose
ATTORNEYS

3,233,191
AMPLITUDE STABILIZED VARIABLE FREQUENCY OSCILLATOR

Jack Brian, Great Neck, N.Y., assignor, by mesne assignments, to Litton Systems, Inc., a corporation of Maryland Filed Mar. 13, 1961, Ser. No. 95,315
5 Claims. (Cl. 331—161)

This invention relates to oscillators, and more particularly, to oscillators in which the output voltage is stabilized.

In many of the radio frequency oscillators of the prior art, changes in frequency produced marked changes in the output power. Thus, for example, with changes in frequencies from two to twenty megacycles, the output from a typical oscillator might vary by twenty decibels or more.

Accordingly, a principal object of the present invention is to reduce variations in output voltage with changes in frequency.

In accordance with the present invention, this object may be achieved by providing an impedance in the oscillator input circuit which is bypassed by a diode. In a preferred embodiment of the invention, the impedance is a radio frequency choke located in the input circuit of a variable frequency crystal oscillator and the diode is connected across the choke.

In accordance with an important feature of the invention, therefore, an oscillator includes an amplifier having an input circuit, a series of crystals which may be selectively connected into the regenerative coupling circuit of the amplifier, a biasing impedance connected to the amplifier input, and a diode connected across the impedance. While transistor amplifiers may be employed, the use of a tube with a radio frequency choke as the biasing impedance in the cathode circuit of the oscillator described above, has proved eminently satisfactory.

As a principal advantage, the present oscillator provides extreme stability of operation over a broad frequency range. It also provides the advantage of minimizing harmonics in the output circuit.

Other objects, features and advantages will become apparent from a consideration of the following detailed description and from the accompanying drawing in which the single figure shows a stabilized oscillator in accordance with the invention.

With reference to the drawing, the oscillator includes a pentode 12 having a plate electrode 14, a cathode 16, and three grids 18, 20 and 22. The output terminal 24 of the oscillator is connected to the plate 14 by the output coupling capacitor 26. The plate supply lead 28 is connected to the anode 14 through a network including resistors 30 and 32 and capacitor 34. Capacitor 34 and resistor 30 comprise a filter circuit which shunts high frequency signals to ground through capacitor 34 and avoids transmission of these high frequency signals into the power line 28. Output signals are developed across resistor 32.

The cathode circuit includes the radio frequency choke coil 36, resistor 38 and diode 40 connected across the choke 36 and resistor 38. Resistor 38 may be omitted if choke 36 has sufficient resistance. Proper bias potential for the cathode 16 is provided by the resistance of elements 36 and 38. They serve to raise the cathode 16 to a low positive potential. The negative grid bias provided by grid leak resistor 42 increases the total bias between the two input electrodes. During oscillations, the cathode potential tends to swing positive and negative. The presence of diode 40 prevents negative excursions of the cathode voltage beyond ground potential. Thus, the cathode voltage swings are limited to a level approximately equal to the normal cathode bias.

The cathode-to-grid coupling circuit includes the two capacitors 44 and 46. The frequency of oscillation of the circuit is determined by the piezoelectric crystal which is connected into the coupling circuit by capacitor 48. As shown in the drawing, any of the crystals 51 through 60, may be selectively connected to the cathode-to-grid coupling circuit by the switch 62.

The frequency of the oscillator may, for example, range from the 2.7 megacycle resonant frequency of crystal 51 to the 20 megacycle resonant frequency of crystal 60. The remaining crystals 52 through 59 provide intermediate frequencies of operation.

In operation, the diode 40 is effectively back-biased by the voltage derived from the direct current resistance of choke 36, and resistor 38 if it is included in the circuit. The direct current resistance of inductor 36 and resistor 38 are chosen to provide the desired output amplitude. Thus, as noted above, the cathode cannot swing to a potential which is below ground, in view of the clipping action of diode 40. If the diode were not present, the amplitude of the output oscillations would be determined by the grid current, the cut-off region of the tube, and by the losses present in the oscillatory circuit. In tests which have been conducted, variations in these parameters have been found to produce output voltage variations of about 20 decibels over the frequency range of 2.7 to 20 megacycles. This is in contrast to the variations of less than 6 decibels when the diode 40 is included in the circuit.

An additional advantage obtained through the use of the diode is a greatly improved output wave form. This improvement is attributable to the fact that the tube is not permitted to operate over its full plate current versus grid voltage characteristic. The frequency stability is also improved in view of the reduced level of crystal current. Furthermore, changes in the direct current supply have less effect upon the frequency and the output amplitude of the oscillator. The resistances 30 and 64 further reduce the effect of variations in the direct current supply. In this regard, it may be seen that any increase in the plate supply voltage will increase the voltage at grid 20, in turn increasing the plate current. This causes an additional voltage drop at the plate which tends to cancel out increases in the plate supply voltage.

By way of example and not of limitation, the values of certain important components which are included in the present circuit are as follows:

Capacitor 44, 20 micromicrofarads;
Capacitor 46, 100 micromicrofarads;
Capacitor 48, 30 micromicrofarads;
Resistor 32, 270 ohms;
Resistor 42, 1 megohm; and
Resistor 64, 82,000 ohms.

It is to be understood that the above-described arrangements are illustrative of the application of the principles of the invention. Numerous other arrangements may be devised by those skilled in the art without departing from the spirit and scope of the invention. Thus, by way of example and not of limitation, the oscillator may include a transistor as the amplification device, and other forms of resonant circuits and feed-back circuits may be substituted for those shown in the drawings. Accordingly, it is to be understood that the present invention is limited only by the spirit and scope of the appended claims.

What is claimed is:

1. A stabilized variable frequency oscillator comprising: a vacuum tube having an anode circuit means for deriving power from said oscillator coupled to said anode, a cathode and at least one grid, a radio frequency choke connected between said cathode and ground, a diode connected across said choke, a plurality of piezoelectric crystals having respectively different frequencies of oscillation, a circuit intercoupling said cathode and grid, and means for selectively connecting one of said crystals into said coupling circuit to change the frequency of oscillation of said oscillator.

2. A stabilized variable frequency oscillator comprising: a vacuum tube amplification device having an anode circuit means for deriving power from said oscillator coupled to said anode, a cathode and at least one grid providing the input terminals to the device, a radio frequency choke connected in the circuit between said cathode and ground, a diode connected across said choke, and resonant circuitry including means for changing the resonant frequency of said oscillator connected between the two input terminals of said device.

3. A stabilized wideband crystal oscillator comprising: a vacuum tube including a cathode, at least two grids and an anode, a source of plate voltage, a pair of resistors connected in series between the anode and the source of supply voltage, a capacitor connected from the point between said two resistors to ground, a resistor connected between the anode and one of said grids, a radio frequency choke connected in the ground lead to said cathode, a diode connected in shunt with said radio frequency choke, a pair of capacitors connected between another of said grids and ground, the point between said pair of capacitors being connected to said cathode, a plurality of piezoelectric crystals having respectively different resonant frequencies, and means for selectively coupling one of said crystals to said vacuum tube to control the frequency of oscillation.

4. A stabilized wideband crystal oscillator comprising: a vacuum tube including a cathode, control grid and anode, a source of plate voltage, a pair of resistors connected in series between the anode and the source of supply voltage, a capacitor connected from the point between said two resistors to ground, a radio frequency choke connected between the cathode and ground, a diode connected in shunt with said radio frequency choke, a pair of capacitors connected between said grid and ground, the point between said pair of capacitors being connected to said cathode, a plurality of piezoelectric crystals having respectively different resonant frequencies, and means for selectively coupling one of said crystals to said grid.

5. A stabilized wideband crystal oscillator comprising:
a vacuum tube including a cathode, at least two grids, and an anode;
a source of plate voltage;
a pair of resistors connected between the anode and the source of plate voltage;
a capacitor connected from the point between said two resistors to ground;
a resistor connected between the anode and a first one of said grids;
a capacitor connected from said first grid to ground;
a radio frequency choke connected in the ground lead to said cathode;
a diode connected in shunt with said radio frequency choke;
a pair of capacitors and a resistor connected in parallel between the second of said grids and ground;
the point between said pair of capacitors being connected to said cathode;
a plurality of piezoelectric crystals having respectively different resonant frequencies; and
means for selectively coupling one of said crystals through a capacitor to said vacuum tube in circuit between said cathode and said second grid to control the frequency of oscillation.

References Cited by the Examiner

UNITED STATES PATENTS

| | | | |
|---|---|---|---|
| 2,632,853 | 3/1953 | Lindley et al. | 331—149 |
| 2,822,470 | 2/1958 | Imm | 328—171 |
| 2,825,810 | 3/1958 | Zeidler | 331—117 X |
| 2,881,321 | 4/1959 | Dauksher et al. | 331—161 |

ROY LAKE, *Primary Examiner.*

GEORGE N. WESTBY, JOHN KOMINSKI, *Examiners.*